(12) United States Patent
Lee et al.

(10) Patent No.: US 7,804,728 B2
(45) Date of Patent: Sep. 28, 2010

(54) INFORMATION HANDLING SYSTEM WITH SRAM PRECHARGE POWER CONSERVATION

(75) Inventors: Michael Ju Hyeok Lee, Austin, TX (US); Bao G Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 12/185,234

(22) Filed: Aug. 4, 2008

(65) Prior Publication Data

US 2010/0027361 A1 Feb. 4, 2010

(51) Int. Cl.
*G11C 11/00* (2006.01)

(52) U.S. Cl. .................................. 365/203; 365/189.01

(58) Field of Classification Search .................. 365/203, 365/189.01
See application file for complete search history.

(56) References Cited

U.S. PATENT DOCUMENTS

| | | | | |
|---|---|---|---|---|
| 5,404,338 | A | * | 4/1995 | Murai et al. ........... 365/189.05 |
| 5,592,426 | A | | 1/1997 | Jallice |
| 5,729,498 | A | | 3/1998 | Yih |
| 5,813,037 | A | | 9/1998 | Martell |
| 5,828,610 | A | | 10/1998 | Rogers |
| 6,061,268 | A | | 5/2000 | Kuo |
| 6,067,256 | A | * | 5/2000 | Yamashita et al. ..... 365/189.04 |
| 6,094,379 | A | * | 7/2000 | Sago ........................... 365/190 |
| 6,108,255 | A | | 8/2000 | Ciraula |
| 6,108,257 | A | | 8/2000 | Davies |
| 6,288,959 | B1 | | 9/2001 | OuYang |
| 6,301,179 | B1 | | 10/2001 | Lawson |
| 6,711,051 | B1 | | 3/2004 | Poplevine |
| 2007/0025140 | A1 | | 2/2007 | Redwine |

FOREIGN PATENT DOCUMENTS

JP          2007220259          8/2007

OTHER PUBLICATIONS

Khanjan—"SRAM Memory Cell"—downloaded from www.cedcc.psu.edu/khanjan/vssram.htm on Jul. 23, 2008.
Kabuo—"An 80-MOPS-peak high-speed and low-power-consumption 16-b digital signal processor", IEEE Journal of Solid-State Circuits, vol. 31, Issue 4, Apr. 1996.
Kimura—"Power Reduction Techniques in Megabit DRAM's"; IEEE Journal of Solid State Circuits, vol. 21, Issue: 3, Jun. 1986.

* cited by examiner

*Primary Examiner*—Michael T Tran
(74) *Attorney, Agent, or Firm*—Stephen J. Walder, Jr.; Diana R. Gerhardt

(57) ABSTRACT

An information handling system (IHS) includes a processor with on-chip or off-chip SRAM array. After a read operation, a control circuit may instruct the SRAM array to conduct a precharge operation, or alternatively, instruct the SRAM array to conduct an equalize bitline voltage operation. A read operation may follow the precharge operation or the equalize bitline voltage operation. The control circuit may instruct the SRAM array to conduct an equalize bitline voltage operation if an equalized voltage of a bitline pair exhibits more that a predetermined amount of voltage. Otherwise, the control circuit instructs the SRAM array to conduct a precharge operation before the next read operation.

14 Claims, 5 Drawing Sheets

INFORMATION HANDLING SYSTEM WITH SRAM PRECHARGE POWER CONSERVATION

BACKGROUND

The disclosures herein relate generally to information handling systems (IHSs), and more specifically, to memory systems that IHSs employ.

Information handling system (IHSs) employ processors that process information or data. A processor may include on-chip memory or employ off-chip memory. Static random access memory (SRAM) is an example of a type of memory that processors may use. Memory cells in an SRAM array typically require a precharge before each reading of memory cell data.

BRIEF SUMMARY

In one embodiment, a method of memory operation is disclosed. The method includes providing an array of static random access memory (SRAM) cells, the array including rows and columns. The method also includes providing true and complement bitlines to each of the columns of the array. The method further includes precharging during a precharge operation, by first and second precharge devices, the true and complement bitlines, respectively, of the columns up to a first predetermined voltage. The method still further includes reading during a read operation, by a sense amplifier, a memory state of a particular cell in a column of the array. The method also includes equalizing during a voltage equalization operation, by an equalization device in each column, voltages on the true and complement bitlines of each column, thus providing an equalized voltage for each of the columns of the array.

In another embodiment, a memory array is disclosed. The memory array includes a plurality of static random access memory (SRAM) cells arranged in rows and columns. Each column includes true and complement bitline pairs. Each column also includes first and second precharge devices that respectively charge the true and complement bitlines of that column up to a first predetermined voltage during a precharge operation. Each column further includes a sense amplifier that reads a memory state of a selected cell in that column during a read operation. Each column also includes a voltage equalization device coupled between the true and complement bitlines of that column to equalize voltage therebetween during a voltage equalization operation, each column thus exhibiting an equalized voltage. The memory array further includes a control circuit, coupled to the columns, that instructs the columns to conduct one of a voltage equalization operation and a precharge operation after read operation.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

In one embodiment, an information handling system (IHS) includes a processor that employs an array of on-chip or off-chip static random access memory (SRAM) to store information. The SRAM array includes rows and columns. True and complement bitlines may select a particular column while wordlines select a particular row in the particular column. Before a read operation for a particular cell, a control circuit may precharge the bitlines of a particular column up to a known voltage such as a voltage rail or supply voltage. With precharge complete, the control circuit conducts a memory read operation for the selected cell. A sense amplifier, such as a differential amplifier, may sense the logical state (0 or 1) of the selected cell and transmit the sensed logic state to a compute element in the processor or other read requester. A read cycle including a precharge operation and a read operation thus completes. Before the next read operation, rather than conducting another precharge operation that may consume significant power, the SRAM array may equalize the voltages on the true and complement bitlines. After such voltage equalization between the bitlines, the SRAM array may conduct another read operation without precharge. In one embodiment, the SRAM array may equalize the voltages between the bitlines after each of multiple successive reads without precharging the bitlines.

Figure 1:
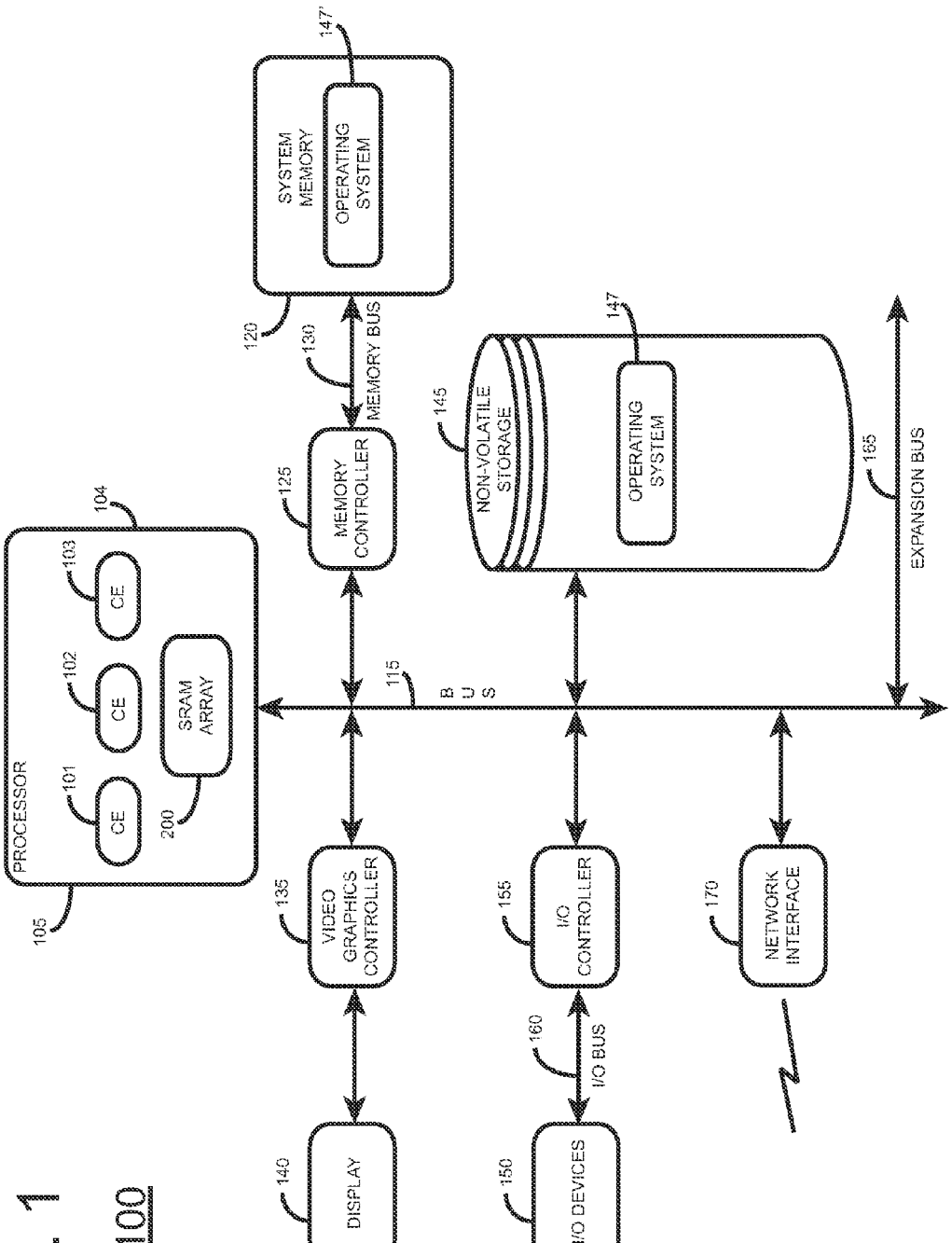
FIG. 1 shows a block diagram of one embodiment of the disclosed information handling system (IHS).

FIG. 1 shows an information handling system (IHS) 100 that includes a processor 105 having multiple compute elements (CEs) such as CE 101, CE 102 and CE 103 on a common semiconductor die 104. Compute elements CE 101, CE 102 and CE 103 may be cores of a multi-core processor. Processor 105 includes an SRAM array 200 that stores information such as instructions and data. IHS 100 processes, transfers, communicates, modifies, stores or otherwise handles information in digital form, analog form or other form. IHS 100 includes a bus 115 that couples processor 105 to system memory 120 via a memory controller 125 and memory bus 130. In one embodiment, system memory 120 is external to processor 105. System memory 120 may be a static random access memory (SRAM) array or a dynamic random access memory (DRAM) array. Processor 105 may also includes local memory (not shown) such as L1 and L2 caches (not shown) on semiconductor die 114. A video graphics controller 135 couples display 140 to bus 115. Nonvolatile storage 145, such as a hard disk drive, CD drive, DVD drive, or other nonvolatile storage couples to bus 115 to provide IHS 100 with permanent storage of information. Operating system 147 loads in memory 120 to govern the operation of IHS 100. I/O devices 150, such as a keyboard and a mouse pointing device, couple to bus 115 via I/O controller 155 and I/O bus 160. One or more expansion busses 165, such as USB, IEEE 1394 bus, ATA, SATA, PCI, PCIE and other busses, couple to bus 115 to facilitate the connection of peripherals and devices to IHS 100. A network interface adapter 170 couples to bus 115 to enable IHS 100 to connect by wire or wirelessly to a network and other information handling systems. While FIG. 1 shows one IHS that employs processor 105, the IHS may take many forms. For example, IHS 100 may take the form of a desktop, server, portable, laptop, notebook, or other form factor computer or data processing system. IHS 100 may take other form factors such as a gaming device, a personal digital assistant (PDA), a portable telephone device, a communication device or other devices that include a processor and memory. When IHS 100 initializes, the IHS loads operating system 147 into system memory 120 for execution as operating system 147'.

Figure 2:
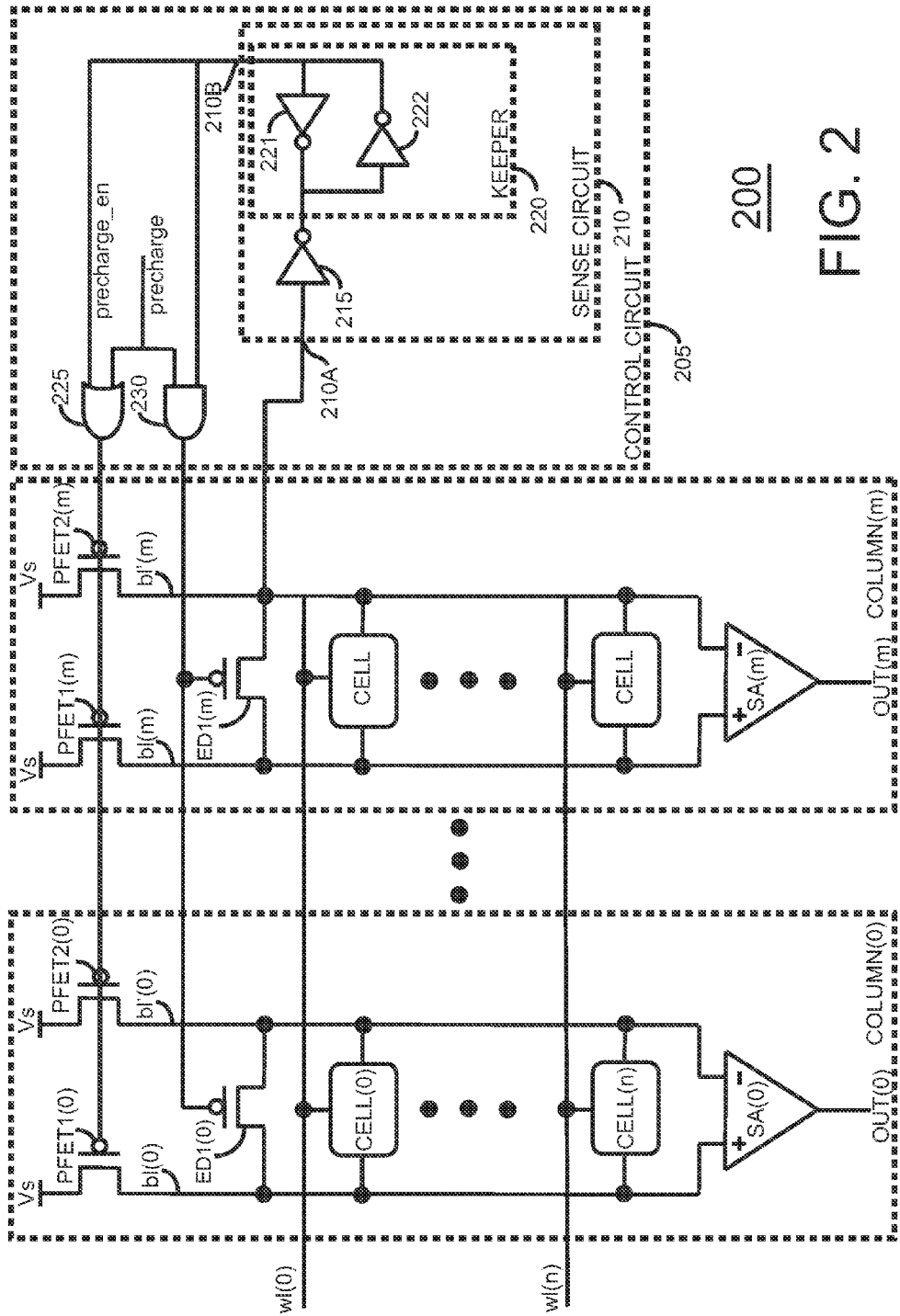
FIG. 2 shows a schematic diagram of the memory array that the IHS of Fig. may employ.

FIG. 2 shows a schematic diagram of SRAM array 200 that includes columns COLUMN(0) ... COLUMN(m) wherein is m+1 is the total number of columns in the array. The following describes a representative column, COLUMN(0), but applies to the other columns of the array as well. COLUMN (0) includes cells CELL(0) ... CELL(n), wherein n+1 is the total number of cells or rows of this column. COLUMN(0) includes true and complement bitlines, namely bl(0) and bl' (0), respectively. Cells CELL(0) ... CELL(n) couple between true bitline bl(0) and complement bitline bl'(0) as shown. Each of these cells may store a respective bit of information. True bitline bl(0) and complement bitline bl'(0) form a bitline pair for COLUMN(0). A switching transistor PFET1(0) couples between true bitline bl(0) and a voltage supply, Vs, namely a voltage rail. Another switching transistor PFET2(0) couples between complement bitline bl'(0) and voltage supply Vs. The gates of switching transistors PFET1(0) and PFET(0) of COLUMN(0) couple together and to gates of like switching transistors in other columns of array 200 as shown. Array 200 includes a control circuit 205 that couples to the gates of the switching transistors PFET1 and PFET2 of each column of the array. In this manner, control circuit 205 may turn switching transistors PFET1(0) and PFET2(0) on to precharge the true and complement bitlines, bl(0) and bl'(0), back to the supply or rail voltage Vs. During a read operation, the voltage on one of the true and complement bitlines may decrease or decay. A precharge can restore the true and complement bitlines to the rail voltage before the next read operation. However, switching transistors PFET1(0) and PFET2(0) may consume significant power during such a precharge operation.

While true and complement bitline signals select a particular column of array 200, wordline signals may select a particular cell of the particular column. Array 200 includes wordlines wl(0) ... wl(n) that correspond to respective rows of the array. A sense amplifier SA(0) includes differential inputs that couple to the true and complement bitlines, bl(0) and bl'(0), of COLUMN(0). Sense amplifier SA(0) is a differential amplifier that includes an output, OUT(0). When the difference voltage at the inputs of the sense amplifier is more than a predetermined amount of voltage, the output OUT(0) of the sense amplifier changes state. In this manner, the signal at the output OUT(0) corresponds to the data in the particular selected cell of COLUMN(0).

While after some read operations, control circuit 205 may instruct switching transistors PFET1 and PFET2 to precharge the true and complement bitlines, after other read operations control circuit 205 may alternatively instruct voltage equalization devices, such as ED1(0), to equalize the voltage between the true and complement bitlines, such as bl(0) and bl'(0). Each column of array 200 includes a respective voltage equalization device such as switching transistors ED1(0) ... ED1(m). The gates of voltage equalization devices ED1(0) ... ED1(m) couple to control circuit 205 so that control circuit 205 may instruct the voltage equalization devices when to equalize the true and complement bitlines. In this manner, while the voltage on one of the true and complement bitlines of a column may decrease during a read, the array may avoid a precharge after each read operation.

A sense circuit 210 includes an input 210A that couples to one of the complement bitlines, such as bl'(m), as shown.

Sense circuit 210 includes an inverter 215 that couples to a keeper 220. Keeper 220 include back-to-back inverters 221 and 222 that together store a logic state, namely one bit of information. Sense circuit 210 includes an output 210B that couples to control circuit 205. Control circuit 205 includes an OR gate 225 and an AND gate 230. The output 210B of sense circuit 205 couples to one input of OR gate 225 and to one input of AND gate 230. The output 210B sends a precharge enable signal, precharge_en, to the inputs of OR gate 225 and AND gate 230 coupled thereto. SRAM array 200 provides a precharge signal to the commonly couple remaining inputs of OR gate 225 and AND gate 230, as shown. Control circuit 205 instructs switching transistors PFET1 and PFET 2 to precharge the true and complement bitlines of the array, or alternatively, instructs voltage equalizing devices ED1 to equalize the voltage between the true and complement bitlines of each column, as described in more detail below.

Figure 3:
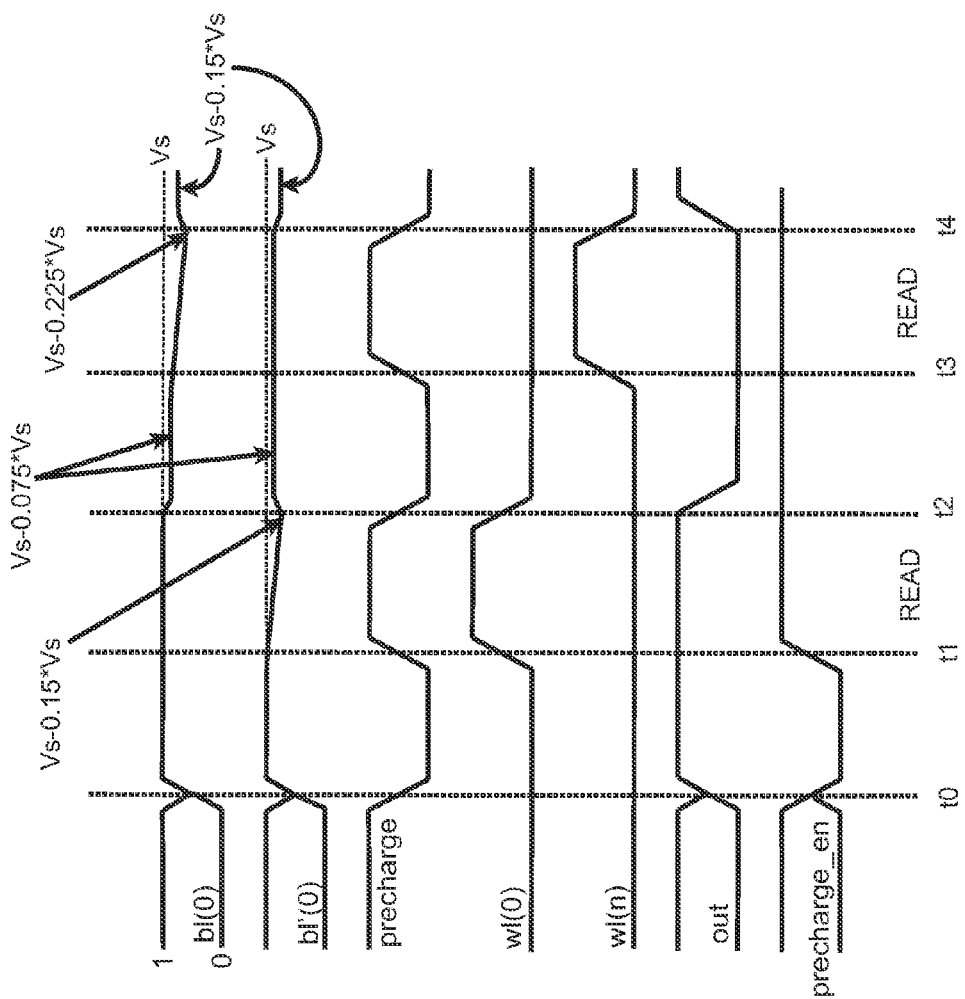
FIG. 3 is a timing diagram of representative signals that the disclosed memory array may employ during successive read operations without a precharge operation.

FIG. 3 is a signal timing diagram that shows aspects of the operation of SRAM array 200. In this particular embodiment, PFET1 and PFET2 of each of the columns are active low devices. Thus, when the gates of PFET1 and PFET2 receive a logic low, PFET1 and PFET2 turn on. Assume that SRAM array 200 commences operation at time t0, as seen in FIG. 3. At time t0, the "precharge" signal goes low. In response, PFET1(0) and PFET2(0) of representative column(0) both turn on, thus coupling the supply rail voltage Vs to the true and complement bitlines, bl(0) and bl'(0). As seen between time t0 and t1 of FIG. 3, both true and complement bitlines b(0) and bl'(0) charge up to the supply rail voltage Vs, for example, to 1 volt. SRAM array 200 is now ready for a read operation.

Near time t1, the precharge signal goes high, thus turning off switching transistors PFET1 and PFET2. Wordline w1(0) goes high near time t1 to select cell(0) of COLUMN(0) for a read operation. A read operation of the selected memory cell occurs between time t1 and t2. The "out" signal OUT(0) at sense amplifier SA(0) represents the logic state of data in the selected cell. Sense amplifier SA(0) is a differential amplifier that detects a difference in the signal between its inputs, namely the signals on true and complement bitlines bl(0) and bl'(0). During the read operation between t1 and t2, the complement bitline voltage bl'(0) decreases by 15% in this particular example. Thus, at time t2, the complement bitline exhibits a voltage=Vs−0.15*Vs, or 850 mv, as seen in FIG. 3. The voltage that true bitline bl(0) exhibits remains at the supply voltage Vs.

At this point in time, rather than precharging complement bitline bl'(0) back up to the supply voltage Vs, control circuit 205 instead instructs voltage equalization device ED1(0) to turn on between times t2 and t3. Turning on ED1(0) equalizes the voltage on the true and complement bitlines b(0) and bl'(0) to the same value, Vs−0.075*Vs, or 925 mv, namely the average between the supply voltage Vs present on true bitline bl(0) at time t2 and the Vs−0.15*Vs voltage present on the complement bitline bl'(0) at time t2. This equalization of the voltage between the true and complement bitlines enables a subsequent read operation without precharge because sense amplifier SA(0) responds to differences between its inputs, namely the true and complement bitlines, during a read operation. Using this technique may result in multiple successive read operations without respective precharge operations. In other words, it is possible to read, equalize bitline voltages, read, equalize bitline voltages, etc. multiple times before again precharging the true and complement bitlines back up to the voltage rail or supply voltage Vs.

After true and complement bitline voltage equalization between times t2 and t3, a read operation occurs between times t3 and t4. During this particular read operation, the voltage on bitline bl(0) decreases to Vs=0.225*Vs, or 775 mv. In the subsequent equalize voltage operation that commences at time t4, control circuit 205 again instructs the voltage equalization devices such as ED1(0) to turn on to equalize the voltages between true and complement bitlines. In response, for example, the true and complement bitlines bl(0) and bl'(0) assume the same voltage value Vs−0.15*Vs after time t4 as seen in FIG. 3. This voltage Vs−0.15*Vs, or 850 mv, is the average of the true and complement bitline voltages at the end of the prior read cycle.

In the particular example above, sense amplifier SA(0) changes state when it senses a 15% voltage differential between its inputs, namely true and complement bitlines bl(0) and bl'(0). Assuming that the supply voltage Vs=1 v, sense amplifier SA(0) will change state at time t2 when the voltage on complement bitline bl'(0) decreases by 15% to Vs−0.075*Vs, namely 850 mv. Since sense amplifier SA(0) responds to a voltage differential between its inputs, it is not necessary to return its inputs back to the supply voltage before each read operation. Instead, array 200 equalizes the voltages between the true and complement bitlines before the next read operation. This process of equalizing voltage, then reading, then equalizing voltage, then reading, may occur multiple times without precharge of the true and complement bitlines. However, after equalizing voltages between the true and complement bitlines multiple times without a precharge, at some point the equalized voltage of the true and complement bitlines may become so low that sense amplifier SA(0) may no longer reliably detect a voltage difference during a read operation. Before SRAM array reaches this point or low voltage threshold, SRAM array 200 should preferably conduct a precharge operation and then the process of precharge, read, equalize voltage, read, equalize voltage, read, equalize voltage, read . . . may begin anew.

Figure 4:
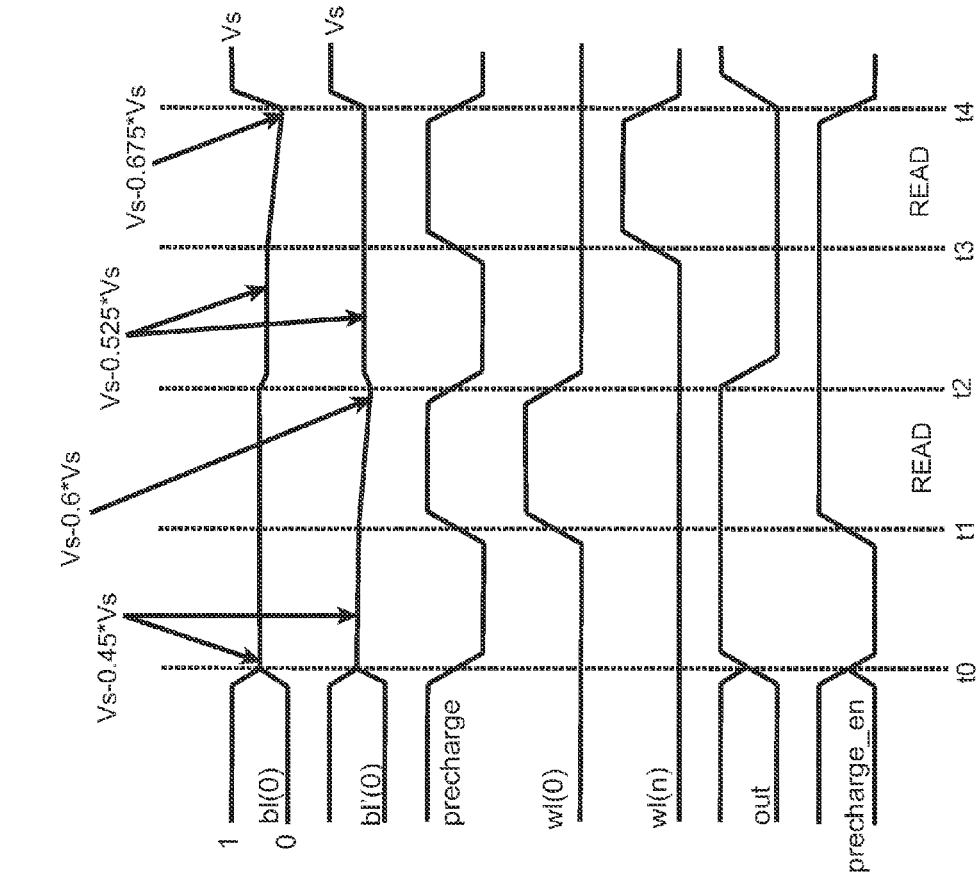
FIG. 4 is a timing diagram of representative signals of the disclosed memory array wherein a precharge operation occurs after a read operation and a subsequent voltage equalization operation.

FIG. 4 shows a representative timing diagram where the voltage between the true and complement bitlines decreases over multiple read, equalize voltage, read, equalize voltage . . . cycles until the equalized voltage between the true and complement bitlines becomes so low that sense amplifier SA(0) may not reliably sense a voltage difference across its inputs. When array 200 reaches this point or low voltage threshold, array 200 precharges the true and complement bitlines back to the voltage rail Vs instead of conducting another equalize voltage between the bitlines operation. In one embodiment, the point at which sense amplifier SA(0) becomes unreliable is approximately 55% of the supply voltage, Vs. However, this voltage value may vary significantly from sense amplifier to sense amplifier depending on sense amplifier cost, complexity and other factors.

In the example of FIG. 4, array 200 may perform many read, equalize voltage cycles (not shown) without precharge before reaching an equalized voltage of Vs−0.45*Vs between true and complement bitlines bl and bl' between time t0 and t1. Subsequent to equalizing the voltage between true and complement bitlines bl(0) and bl'(0) between time t0 and t1, array 200 performs a read operation between time t1 and t2. During this read operation, the voltage on complement bitline bl'(0) decreases further to Vs−0.6*Vs. After the read operation, control circuit 205 instructs the voltage equalization devices such as ED(0) to turn on to equalize the voltage between true and complement bitlines bl(0) and bl'(0). Thus, during this equalize voltage operation between time t2 and t3, the resultant equalized voltage across true and complement bitlines bl(0) and bl'(0 is Vs−0.525*Vs. Another read operation follows in the time between t3 an t4. During this read operation, the voltage on true bitline bl(0) decreases even further to Vs=0.675*Vs. This voltage is now at a point so low that control circuit 205 instructs the PFET1 and PFET2 transistors throughout the array 200 to perform precharge operations on the true and complement bitlines bl and bl'. The process of precharge, read, equalize voltage, read . . . may then start again anew.

In more detail, control circuit 205 may control precharge and bitline voltage equalization operations in array 200. Keeper 220 of sense circuit 210 provides a precharge enable signal, "precharge_en", to one input of OR gate 225 and to one input of AND gate 230. Array 200 provides a "precharge" signal to one input of OR gate 225 and to one input of AND gate 230, as shown. In response to the precharge enable signal, precharge_en, control circuit 205 either instructs array 200 to conduct a bitline voltage equalization operation or a precharge operation.

When the precharge_en signal at sense circuit output 210B exhibits a logic 1, this enables the precharge signal to pass through AND gate 230 to turn equalize voltages devices ED1 and ED2 on. Alternatively, when the precharge_en signal at sense circuit output 210B exhibits a logic 0, this causes AND gate 230 to block the precharge signal from turning on the equalize voltage devices, and instead OR gate 225 propagates the precharge signal to PFET1 and PFET2. When the precharge signal reaches PFET1 and PFET2, this causes precharge operations on the true and complement bitlines throughout array 200. Thus, in one embodiment, control circuit 205 either instructs array 200 to conduct an equalize voltage operation between the bitlines of a column or to conduct a precharge operation on the bitlines of a column. In one embodiment, control circuit 205 instructs the array 200 to conduct equalize voltage operations in all the columns of the array or instructs the array to conduct precharge operations on the bitlines of all of the columns of the array.

Array 200 may conduct multiple successive read and equalize bitline voltage operations until a precharge operation in necessary. In other words, array 200 may conduct multiple read and equalizes voltage operations, one after the other in alternating fashion, until the equalized voltage between the true and complement bitlines bl and bl' decreases to a low voltage threshold or point at which the sense amplifiers, such as SA(0) . . . SA(m) no longer function reliably. When the equalized voltage between the true and complement bitlines decreases to this predetermined low voltage threshold, control circuit 205 instructs all the precharge devices, PFET1 and PFET2, throughout the array to conduct a precharge operation. This returns the true and complement bitlines of the array to the Vs supply voltage rail.

Figure 5:
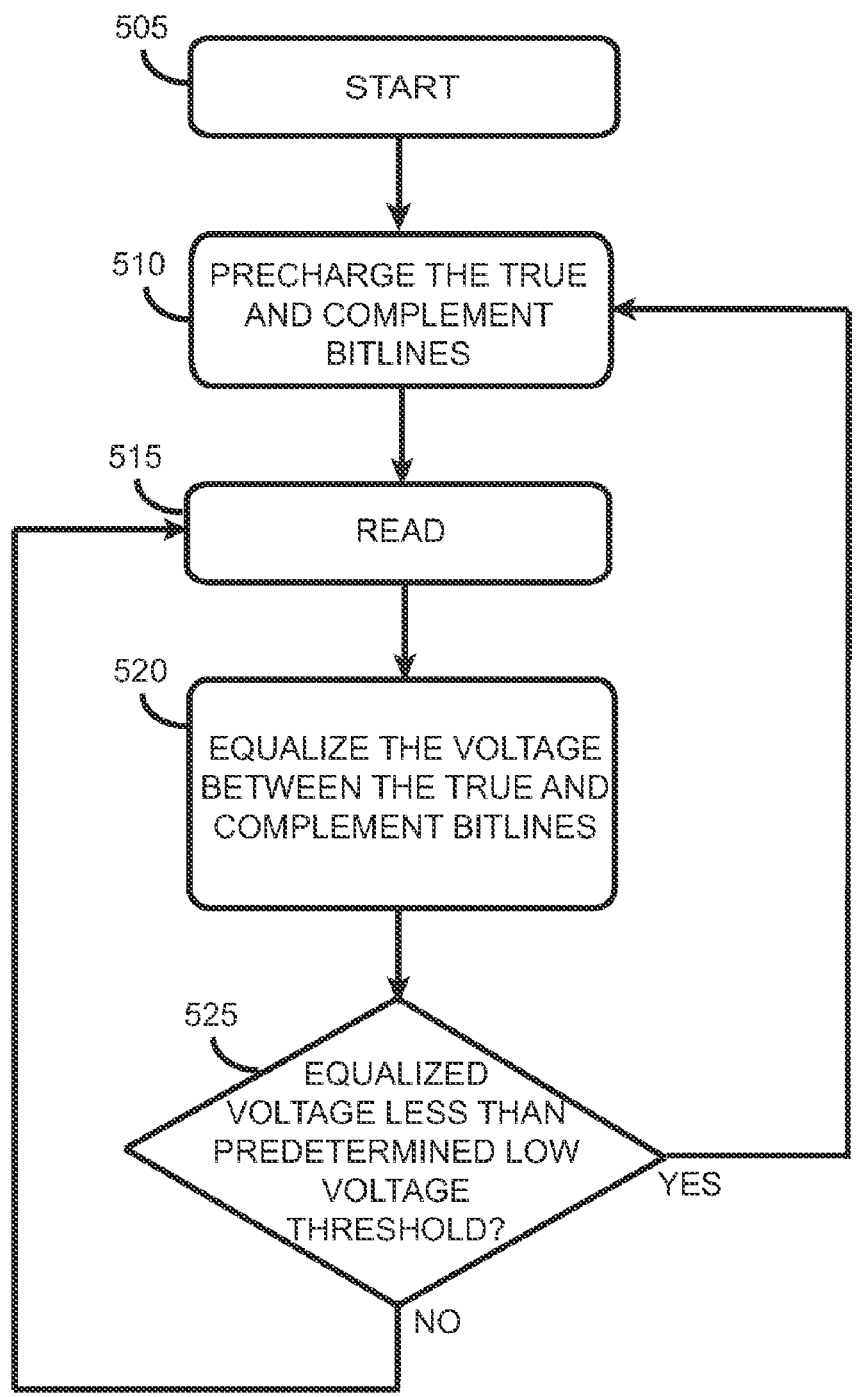
FIG. 5 is a flowchart that depicts process flow in the disclosed memory array of an IHS.

FIG. 5 is a flowchart that summarizes representative steps in the operation of SRAM array 200 of IHS 100. IHS 100 initializes and commences operation, as per start block 505. SRAM array 200 precharges the true and complement bitlines across the array in a precharge operation, as per block 510. For example, array 200 precharges true and complement bitlines bl(0) and bl'(0) of COLUMN(O) as well as the other columns of the array up to and including COLUMN(m). Array 200 may perform this precharge operation by activating PFET1(0), PFET2(0), . . . PFET1(m), PFET2(m) to drive the supply rail voltage Vs onto respective true and complement bitlines per column. IHS 100 then performs a read operation on array 200, as per block 515. For example, processor 105 may perform a read of SRAM array 200 at a particular column that the true and complement bitlines indicates and a particular row that a wordline indicates. This precharge operation and read operation completes one read cycle.

After this read operation, instead of immediately performing another precharge operation, array 200 equalizes the voltage between the true and complement bitlines of the column where array 200 performed the previous read operation, as well as the other columns of array 200, as per block 520. In one embodiment, all columns of array 200 may perform a read operation. Control circuit 205 may instruct voltage equalization of the bitline pairs of all columns, or alternatively, instruct the precharge of all columns. For example, array 200 equalizes the voltage between true and complement bitlines bl(0) and bl'(0) of COLUMN(0). Control circuit 205 of array 200 performs a test to determine if the equalized voltage decreased during the read operation to less than a predetermined low threshold voltage, as per decision block 525. In one embodiment, control circuit 205 monitors the equalized voltage of one column, namely COLUMN(m), of array 200 as shown in FIG. 2. If the equalized voltage after the read operation is not less than the predetermined low threshold voltage, then the array 200 may perform another read operation in the same column as the last read operation without precharging, as per block 515. In this manner, many successive read operations may be possible without respective precharge operations provided the equalized voltage does not decrease to less than the predetermined low threshold voltage. However, if after a read operation the equalized voltage decreases to less than the predetermined threshold voltage at decision block 525, then array 200 conducts a precharge operation across all columns, as per block 510. In array 200, a read cycle may include a read operation followed by a precharge operation, or alternatively, a read operation followed by a voltage equalization operation. Multiple successive read operations followed by respective voltage equalization operations are possible, provided the equalized voltage between the true and complement bitlines does not decrease to a value less than a predetermined low threshold voltage. In this manner, array 200 may consume less power when array 200 does not turn on precharge devices PFET1 and PFET2 across the array during each read cycle.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of memory operation, comprising:
   providing an array of static random access memory (SRAM) cells, the array including rows and columns of SRAM cells;
   providing true and complement bitlines to each of the columns of the array;
   precharging during a precharge operation, by first and second precharge devices, the true and complement bitlines, respectively, of the columns up to a first predetermined voltage;
   reading during a read operation, by a sense amplifier, a memory state of a particular cell in a column of the array;
   equalizing during a voltage equalization operation, by an equalization device in each column, voltages on the true and complement bitlines of each column, thus providing an equalized voltage for each of the columns of the array;
   determining, by a control circuit, if the equalized voltage of a column of the array is less than a second predetermined voltage; and
   performing another read operation after the voltage equalization operation when the control circuit determines that the equalized voltage of a column of the array is not less than the second predetermined voltage.

2. The method of claim 1, further comprising:
   performing another precharge operation after the voltage equalization operation when the control circuit determines that the equalized voltage of a column of the array is less than the second predetermined voltage.

3. The method of claim 1, wherein the first predetermined voltage is a supply voltage.

4. The method of claim 1, wherein the array performs one of a precharge operation and a voltage equalization operation after each read operation.

5. The method of claim 1, further comprising deactivating precharge switching transistors during voltage equalization operations.

6. A memory array, comprising:
   a plurality of static random access memory (SRAM) cells arranged in rows and columns;
   each column including true and complement bitline pairs;
   each column including first and second precharge devices that respectively charge the true and complement bitlines of that column up to a first predetermined voltage during a precharge operation;
   each column including a sense amplifier that reads a memory state of a selected cell in that column during a read operation;
   each column including a voltage equalization device coupled between the true and complement bitlines of that column to equalize voltage therebetween during a voltage equalization operation, each column thus exhibiting an equalized voltage; and
   a control circuit, coupled to the columns, that instructs the columns to conduct one of a voltage equalization operation and a precharge operation after read operation, wherein the control circuit determines if the equalized voltage of a column is less than a second predetermined voltage, and wherein the memory array is configured to perform another read operation after the voltage equalization operation when the control circuit determines that the equalized voltage of a column of the memory array is not less than the second predetermined voltage.

7. The memory array of claim 6, wherein the memory array is configured to perform another precharge operation after the voltage equalization operation when the control circuit determines that the equalized voltage of a column of the memory array is less than the second predetermined voltage.

8. The memory array of claim 6, wherein the first predetermined voltage is a supply voltage.

9. The memory array of claim 6, wherein the memory array performs one of a precharge operation and a voltage equalization operation after each read operation.

10. The memory array of claim 6, wherein the memory array is configured to deactivate precharge switching transistors during voltage equalization operations.

11. An information handling system (IHS), comprising:
   a memory;
   a processor, coupled to the memory, the processor including:
      a plurality of static random access memory (SRAM) cells arranged in rows and columns to form an SRAM memory array;
      each column including true and complement bitline pairs;
      each column including first and second precharge devices that respectively charge the true and complement bitlines of that column up to a first predetermined voltage during a precharge operation;
      each column including a sense amplifier that reads a memory state of a selected cell in that column during a read operation;
      each column including a voltage equalization device coupled between the true and complement bitlines of that column to equalize voltage therebetween during a voltage equalization operation, each column thus exhibiting an equalized voltage; and
      a control circuit, coupled to the columns, that instructs the columns to conduct one of a voltage equalization operation and a precharge operation after read operation, wherein the control circuit determines if the equalized voltage of a column is less than a second predetermined voltage, and wherein the array is configured to perform another read operation after the voltage equalization operation when the control circuit determines that the equalized voltage of a column of the array is not less than the second predetermined voltage.

12. The IHS of claim 11, wherein the SRAM memory array is configured to perform performing another precharge operation after the voltage equalization operation when the control circuit determines that the equalized voltage of a column of the array is less than the second predetermined voltage.

13. The IHS of claim 11, wherein the SRAM memory array performs one of a precharge operation and a voltage equalization operation after each read operation.

14. The IHS of claim 11, wherein the SRAM memory array is configured to deactivate precharge switching transistors during voltage equalization operations.

* * * * *